United States Patent
Shih et al.

(10) Patent No.: US 9,621,147 B2
(45) Date of Patent: Apr. 11, 2017

(54) GATE PULSE MODULATION WAVEFORM-SHAPING CIRCUIT

(71) Applicant: InnoLux Corporation, Miao-Li County (TW)

(72) Inventors: Ching-Wen Shih, Miao-Li County (TW); Fu-Hsien Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/949,941

(22) Filed: Nov. 24, 2015

(65) Prior Publication Data

US 2016/0173078 A1    Jun. 16, 2016

(30) Foreign Application Priority Data

Dec. 12, 2014   (TW) .............................. 103143472 A

(51) Int. Cl.
*H03K 7/08* (2006.01)

(52) U.S. Cl.
CPC ...................... *H03K 7/08* (2013.01)

(58) Field of Classification Search
CPC   H03K 7/08; H03K 3/284; H03K 5/01; H03K 5/06; H03K 5/04; H03K 5/07; H03K 5/1565; H03K 5/05; H03K 3/017

USPC ................................................. 327/172–176
See application file for complete search history.

(56) References Cited

U.S. PATENT DOCUMENTS

| 7,692,464 | B2 * | 4/2010 | Murakami | ............... | H03K 7/08 |
| | | | | | 327/172 |
| 8,841,950 | B2 * | 9/2014 | Somayajula | ............... | H03F 1/26 |
| | | | | | 327/172 |
| 2010/0156491 | A1 * | 6/2010 | Kuan | ....................... | H03K 7/08 |
| | | | | | 327/172 |
| 2011/0157132 | A1 | 6/2011 | Byun et al. | | |

* cited by examiner

*Primary Examiner* — Long Nguyen
(74) *Attorney, Agent, or Firm* — Bacon & Thomas, PLLC

(57) ABSTRACT

A gate pulse modulation waveform-shaping circuit includes an input terminal, an output pair, and a gate pulse modulation waveform-shaping control circuit. The input terminal receives a control signal. The output pair is connected to a scan line for outputting a gate output voltage. The gate pulse modulation waveform-shaping control circuit is connected to the output pair for adjusting a voltage waveform on the scan line. The gate pulse modulation waveform-shaping control circuit is based on the control signal to use a time interval or fixed discharge voltage to generate a desired delay for adjusting a discharge slope thereby generating different discharge time on the scan line, so that the gate output voltage has a voltage waveform including at least two waveform segments each with a non-zero sliding slope and at least two waveform segments each with a zero slope.

10 Claims, 13 Drawing Sheets

FIG. 3

| k | | Multiple | Frequency (f) | Time (t) | Total Time ($T_{tot}$) | Amount |
|---|---|---|---|---|---|---|
| 1 | S | $m_1$ | $f_1$ | $\Delta T1$ | $m_1 \times \Delta T1$ | $X_1$ |
| | D | $n_1$ | $f_2$ | $\Delta T2$ | $n_1 \times \Delta T2$ | |
| 2 | S | $m_2$ | $f_1$ | $\Delta T1$ | $m_2 \times \Delta T1$ | $X_2$ |
| | D | $n_2$ | $f_2$ | $\Delta T2$ | $n_2 \times \Delta T2$ | |
| ... | | | | | | |

GATE PULSE MODULATION WAVEFORM-SHAPING CIRCUIT

BACKGROUND OF THE INVENTION

1. Field of the Invention

The present invention relates to the technical field of LCD devices and, more particularly, to a gate pulse modulation waveform-shaping circuit.

2. Description of Related Art

Currently, the liquid crystal display (LCD) is the most common flat display device, which has the advantages of compactness, low power consumption, and low radiation. The operating principle of LCD is to regulate the voltage difference between two ends of a liquid crystal layer to change the arrangement of liquid crystal molecules in the liquid crystal layer thereby changing the transmittance of the liquid crystal layer, and to further make use of a light source provided by a backlight module to display an image.

The LCD device includes a plurality of pixel units, a source driver, and a gate driver. The source driver provides a plurality of data signals to the plurality of pixel units. The gate driver generates a plurality of gate signals to activate the corresponding pixel units and thus control a write operation of the data signals. The gate driver is connected to the scan lines of an LCD panel, and there are parasitic capacitance and resistance on the scan lines. Due to the resistance-capacitance (RC) load effect, signal on the scan line which is distant from the gate driver may present a dragging situation, so that the waveform of the signal on the scan line which is close to the gate driver is quite different from that distant from the gate driver, resulting in that the brightness at left and right sides of a frame is different.

To overcome this problem, the prior art makes use of a gate pulse modulation (GPM) to lengthen the falling edge of the waveform so as to reduce the waveform difference of the signal on the scan line close to and distant from the gate driver. FIG. 1 is a schematic diagram of a typical gate pulse modulation unit 120. As shown in FIG. 1, the GPM unit 120 is arranged in a pulse width modulation integrated circuit (PWM IC) 110. The GPM unit 120 turns a PMOS transistor 130 on and turns a PMOS transistor 140 off at a high potential VGH of a control signal GVOFF, and turns the PMOS transistor 130 off and turns the PMOS transistor 140 off at a low potential VGL of the control signal GVOFF. Due to the RC effect, the falling edge of the signal VGHM is lengthened to thus reduce the waveform difference of the signal on the sane line close to and distant from the gate driver. Accordingly, the brightness at two ends of a frame becomes similar.

As shown in FIG. 1, the capacitance C is an equivalent capacitance on the scan line, but not a physical capacitor. The function of the typical GPM unit 120 is to control the slope through the RC (resistance and capacitance) discharge. However, because different LCD panels require different slopes, the value of the resistance R has to be adjusted to satisfy the actual requirement, which may cause a material preparation problem on production as different types of LCD panels require different resistance values. Another approach is to use a variable resistor to perform the resistance adjustment in the PWM IC 110. However, such a way to implement the resistor in the IC may overheat the IC, and even burn down the IC. Therefore, it is desirable to provide an improved gate pulse modulation waveform-shaping circuit to mitigate and/or obviate the aforementioned problems.

SUMMARY OF THE INVENTION

The object of the present invention is to provide a gate pulse modulation waveform-shaping circuit, which can change the voltage waveform of a signal on a scan line by using resistor of the same value, such that the waveform difference of the signal on the scan line close to and distant from a gate driver can be reduced. Thus, the brightness at left and right portions of a frame is similar. In addition, the problem of overheating an IC can be overcome as the resistor implemented in the IC is avoided.

To achieve the object, the present invention provides a gate pulse modulation waveform-shaping circuit, which includes: an input terminal for receiving a control signal; an output pair connected to a scan line for outputting a gate output voltage; and a gate pulse modulation waveform-shaping control circuit connected to the output pair, wherein the gate pulse modulation waveform-shaping control circuit is based on the control signal to use a time interval or a fixed discharge voltage to generate a delay for adjusting a discharge slope thereby generating different discharge time on the scan line, so that the gate output voltage has a voltage waveform, the voltage waveform including a plurality of waveform segments, the voltage waveform including at least two of the waveform segments each with a non-zero sliding slope and at least two of the waveform segments each with a zero slope.

Other objects, advantages, and novel features of the invention will become more apparent from the following detailed description when taken in conjunction with the accompanying drawings.

BRIEF DESCRIPTION OF THE DRAWINGS

FIG. 3 is a schematic diagram of a shaping register and a delay register in accordance with the invention;

FIG. 8 is a schematic diagram of detail data for each section in FIG. 7 in accordance with the invention;

DETAILED DESCRIPTION OF THE EMBODIMENT

Figure 2:
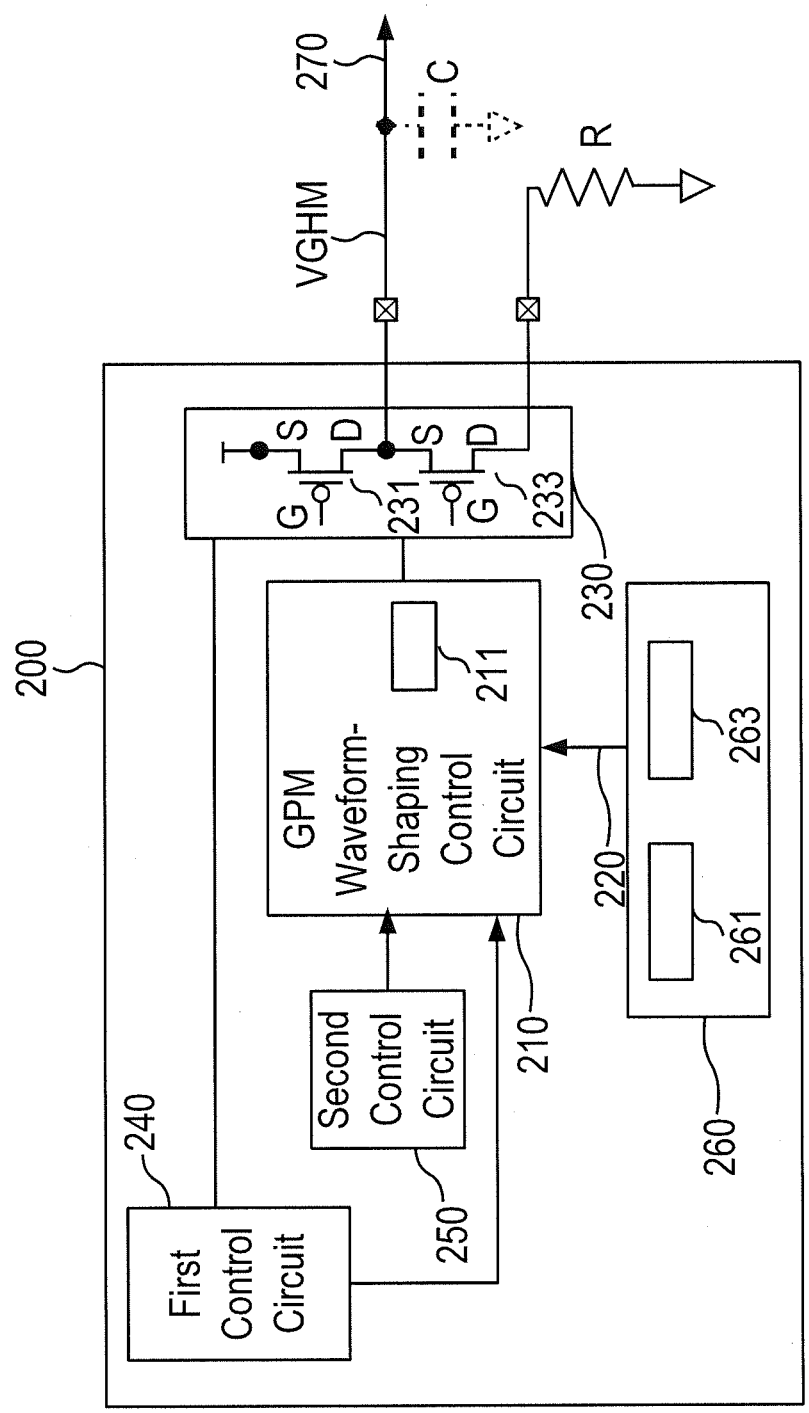
FIG. 2 is a block diagram of a gate pulse modulation waveform-shaping circuit in accordance with the invention.

FIG. 2 is a block diagram of a gate pulse modulation waveform-shaping circuit 200 in accordance with the invention. The gate pulse modulation waveform-shaping circuit 200 includes a gate pulse modulation waveform-shaping control circuit 210, an input terminal 220, an output pair 230, a first control circuit 240, a second control circuit 250, and a delay parameter circuit 260.

The input terminal 220 is employed to receive a control signal. The control signal is provided by the delay parameter circuit 260. The output pair 230 is connected to a scan line 270 for outputting a gate output voltage. The output pair 230 has a first PMOS transistor 231 and a second PMOS transistor 233.

The first PMOS transistor 231 has a source connected to a high voltage and a drain connected to the scan line 270 and a source of the second PMOS transistor 233. The second PMOS transistor 233 has a drain connected to an external resistance R.

The gate pulse modulation waveform-shaping control circuit 210 is connected to the output pair 230 to adjust the voltage waveform on the scan line 270. The gate pulse modulation waveform-shaping control circuit 210 is based on the control signal to use a time interval or fixed discharge voltage to generate a desired delay for adjusting a discharge slope thereby generating different discharge time on the scan line 270, so that the gate output voltage has a voltage waveform including a plurality of waveform segments. Specifically, the voltage waveform includes at least two of the waveform segments each with a non-zero sliding slope and at least two of the waveform segments each with a zero slope.

In this embodiment, the gate pulse modulation waveform-shaping control circuit 210 is connected to a gate of the second PMOS transistor 233 of the output pair 230 so as to use the time interval to turn on or turn off the second PMOS transistor according to the control signal, thereby generating the desired delay to adjust the discharge slope and generate different discharge time on the scan line 270, so that the gate output voltage has a voltage waveform including at least two waveform segments each with a non-zero sliding slope and at least two waveform segments each with a zero slope.

The first control circuit 240 is connected to the output pair 230 for controlling the output timing and voltage value of the gate output voltage. The first control circuit 240 controls the first PMOS transistor 231 by turning on the first PMOS transistor 231 to generate a rising edge of the gate output voltage.

The second control circuit 250 is connected to the gate pulse modulation waveform-shaping control circuit 210 for controlling the output pair 230 to be turned on and off.

The delay parameter circuit 260 is connected to the gate pulse modulation waveform-shaping control circuit 210. The delay parameter circuit 260 stores at least one code, such that the gate pulse modulation waveform-shaping control circuit 210 can use the code to configure different parameters for adjusting additional delay time, in addition to a basic discharge time, thereby generating the time interval and the desired delay, so as to adjust the discharge slope for generating different discharge time on the scan line.

Figure 1:
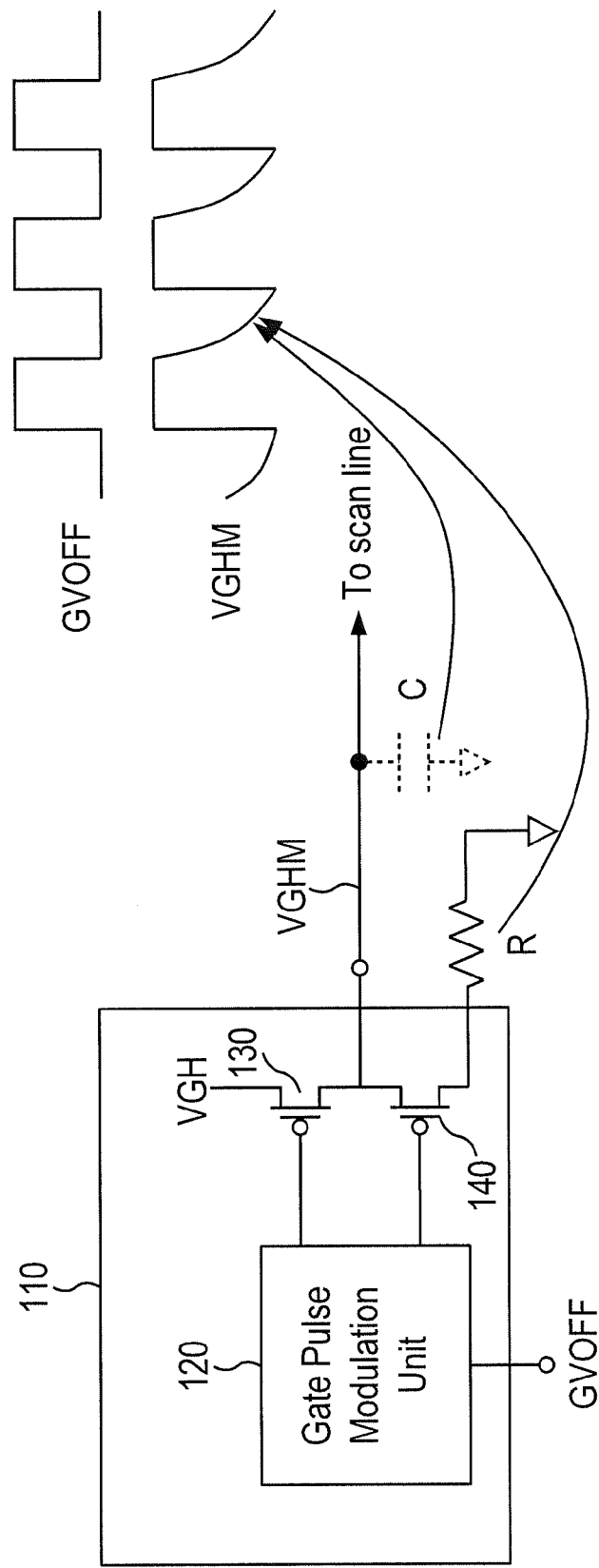
FIG. 1 is a schematic diagram of a typical gate pulse modulation unit.
Figure 3:
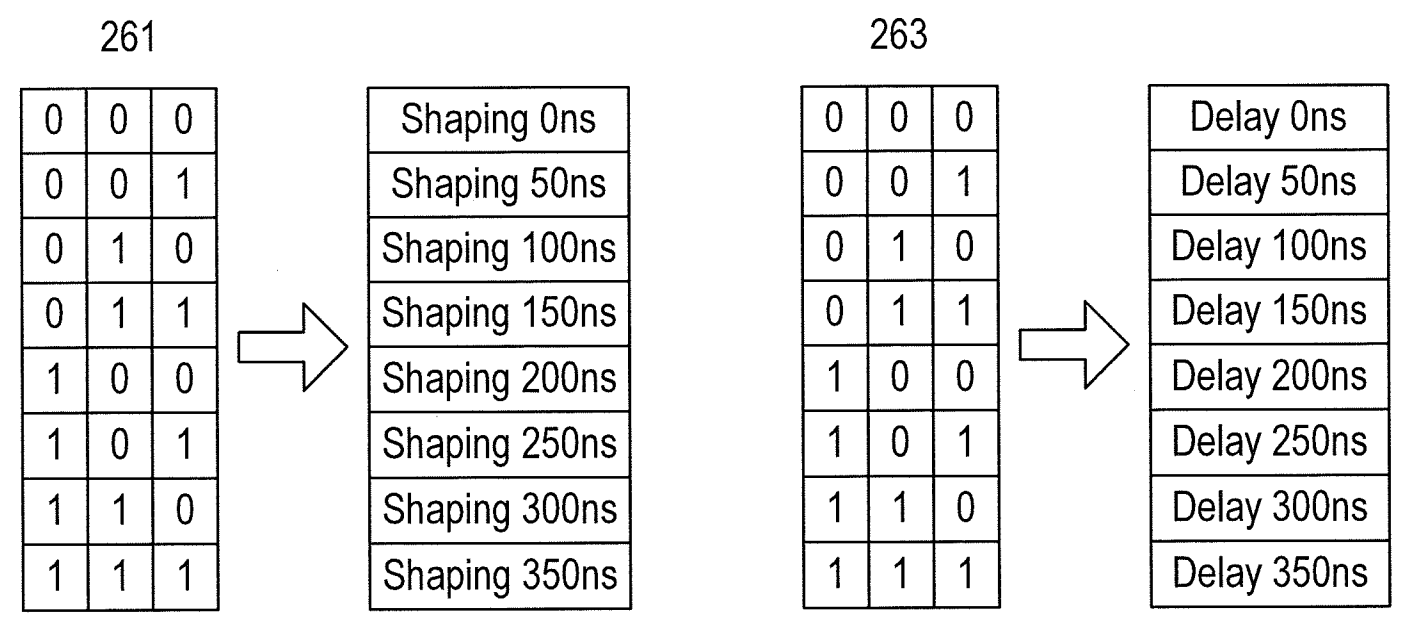

The delay parameter circuit 260 has a shaping register 261 and a delay register 263. The shaping register 261 and the delay register 263 form the at least one code. FIG. 3 is a schematic diagram of the shaping register 261 and the delay register 263 in accordance with the invention. When the shaping register 261 and the delay register 263 store 000b and 000b, respectively, it indicates that the gate pulse modulation waveform-shaping control circuit 210 does not add delay and does not prescribe an RC sliding time (or RC discharge time). In this case, the waveform of the gate output voltage is identical to that of the prior art shown in FIG. 1.

When the shaping register 261 and the delay register 263 store 001b and 001b, respectively, it indicates that the gate pulse modulation waveform-shaping control circuit 210 prescribes the RC sliding time (or RC discharge time) to be 50 ns and adds a delay of 50 ns. When the shaping register 261 and the delay register 263 store 001b and 002b, respectively, it indicates that the gate pulse modulation waveform-shaping control circuit 210 prescribes the RC sliding time (or RC discharge time) to be 50 ns and adds a delay of 100 ns, and so on.

Figure 4:
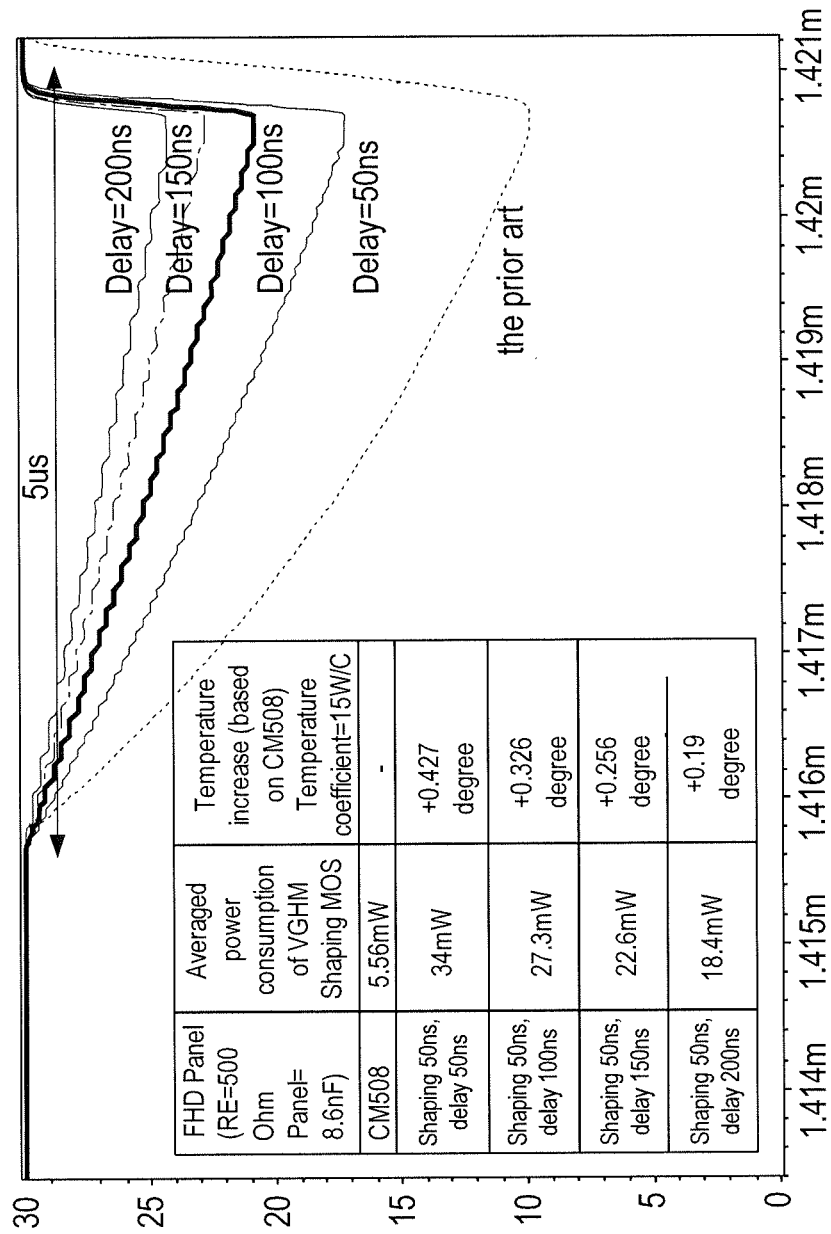
FIG. 4 schematically illustrates a simulation of a gate pulse modulation waveform-shaping circuit in accordance with the invention.
Figure 5:
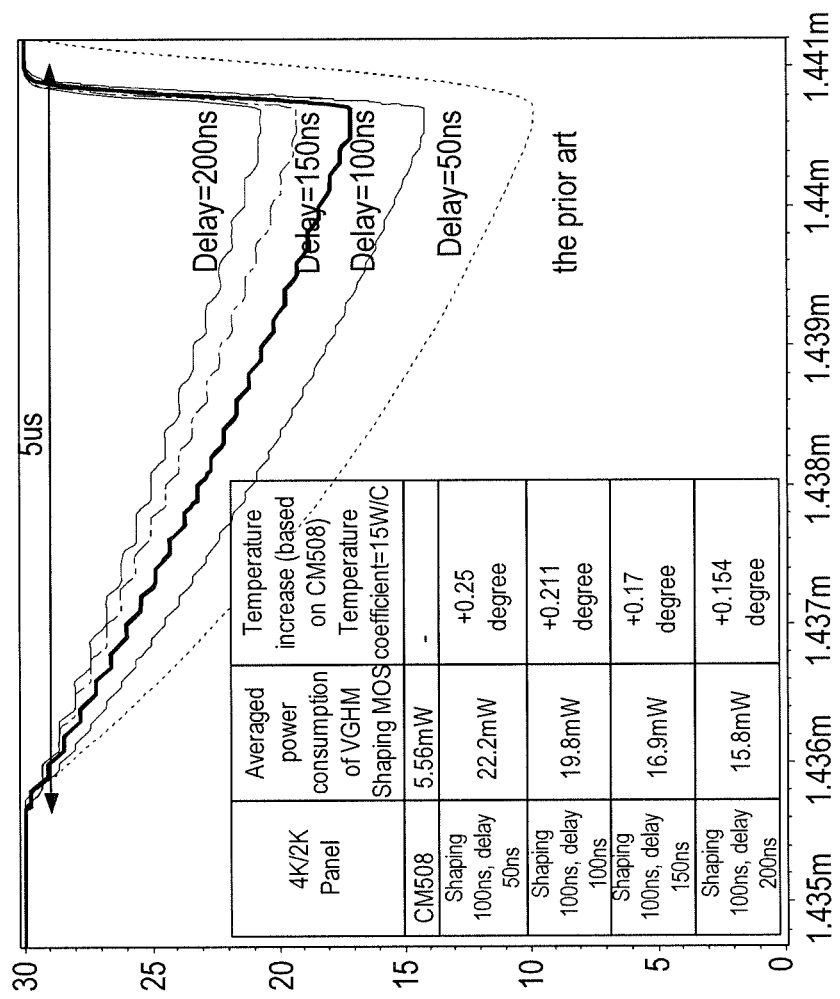
FIG. 5 schematically illustrates another simulation of a gate pulse modulation waveform-shaping circuit in accordance with the invention.

FIG. 4 schematically illustrates a simulation of the gate pulse modulation waveform-shaping circuit 200 in accordance with the invention. In FIG. 4, the delay register is configured to store 001b, 010b, 011b, and 100b, respectively. FIG. 5 schematically illustrates another simulation of the gate pulse modulation waveform-shaping circuit 200 in accordance with the invention. In FIG. 5, the shaping register is configured to store 010b and the delay register is configured to store 001b, 010b, 011b, and 100b, respectively. As shown in FIGS. 4 and 5, in the prior art, when the resistance R is fixed, its discharge slope is also fixed. However, in the invention, different discharge slopes can be generated by adjusting the contents of the shaping register 261 and the delay register 263.

Figure 6A:
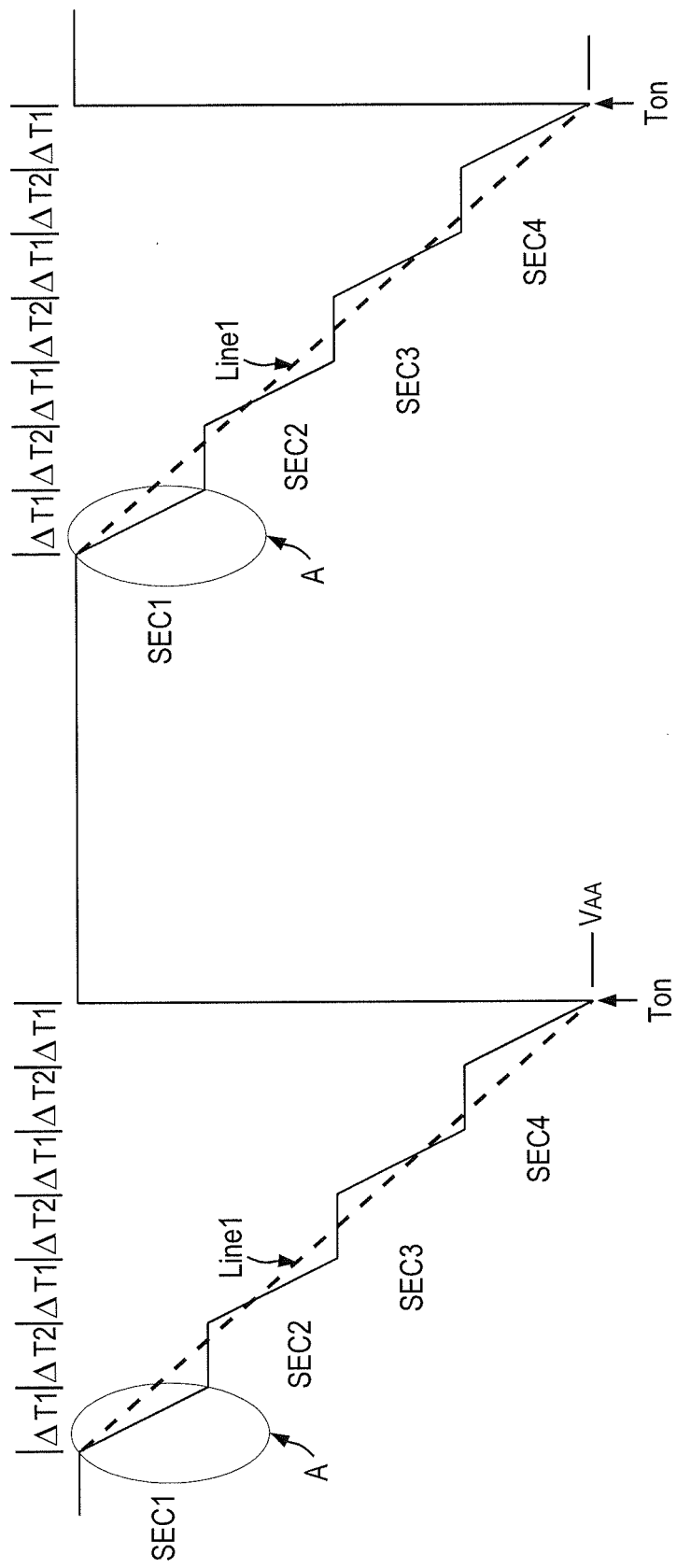
FIGS. 6A and 6B schematically illustrate an operation of a gate pulse modulation waveform-shaping circuit in accordance with the invention.
Figure 6B:
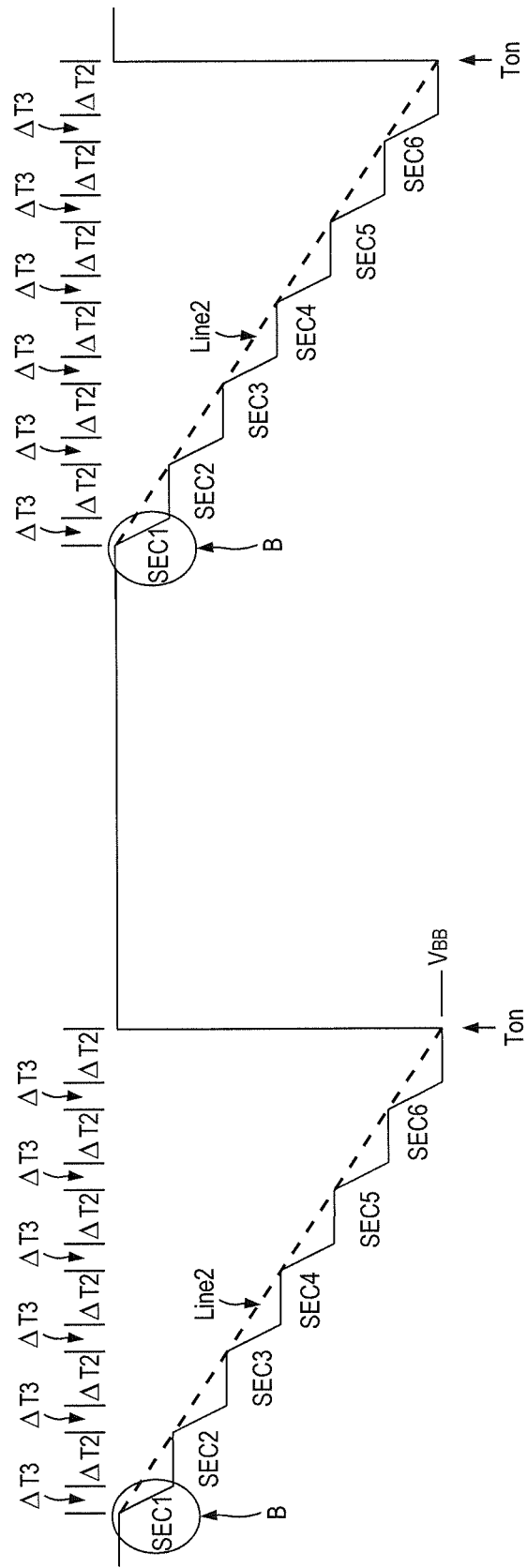

The gate pulse modulation waveform-shaping control circuit 210 further includes an oscillator 211. The frequency range of the oscillator 211 is varied, depending on different types of panels, for generating different discharge time intervals ($\Delta T1$, $\Delta T3$), i.e. generating different shaping time intervals ($\Delta T1$, $\Delta T3$). The oscillator 211 can generate a first frequency (f1) oscillation signal and a second frequency (f2) oscillation signal. The shaping time interval $\Delta T1$ equals $1/f1$, and the shaping time interval $\Delta T2$ equals $1/f2$. FIGS. 6A and 6B schematically illustrate an operation of the gate pulse modulation waveform-shaping circuit 210 in accordance with the invention. As shown in FIGS. 6A and 6B, in the time interval $\Delta T1$, the gate pulse modulation waveform-shaping control circuit 210 turns on the second PMOS transistor 233 for performing a discharge and, in the time interval $\Delta T2$, the gate pulse modulation waveform-shaping control circuit 210 turns off the second PMOS transistor 233 for maintaining the voltage VGHM. Accordingly, by changing the time intervals $\Delta T1$, $\Delta T2$, $\Delta T3$, etc., the discharge slope can be adjusted so as to generate different discharge time on the scan line 270, such that the gate output voltage has a voltage waveform including at least two waveform segments each with a non-zero sliding slope and at least two waveform segments each with a zero slope.

Also with reference to FIG. 2, the gate pulse modulation waveform-shaping control circuit 210 controls the second PMOS transistor 233 to be turned on for generating a low potential VGL of the gate output voltage. In this case, the falling edge of the gate output voltage has different discharge time.

In FIGS. 6A and 6B, as shown by the ovals A and B, the slopes during discharge are the same, but the slopes of Line 1 and Line 2 become different when the time intervals are changed. In addition, at time Ton, the first control circuit 240 turns the first PMOS transistor 231 on, and the second control circuit 250 turns the second PMOS transistor 233 off. Accordingly, the voltage VGHM rises again.

As shown in FIGS. 6A and 6B, each of Line1 and Line2 is composed of at least one discharge section SEC. In this case, Line1 is composed of four discharge sections SEC1-SEC4 while Line2 is composed of six discharge sections SEC1-SEC6. Each discharge section is composed of n discharge time intervals ($\Delta T1$, $\Delta T3$) and m delay time intervals (ΔT2). For example, each discharge section SEC in FIG. 6A is composed of one ΔT1 and one ΔT2, and each discharge section SEC in FIG. 6B is composed of one ΔT3 and one ΔT2.

Figure 7:
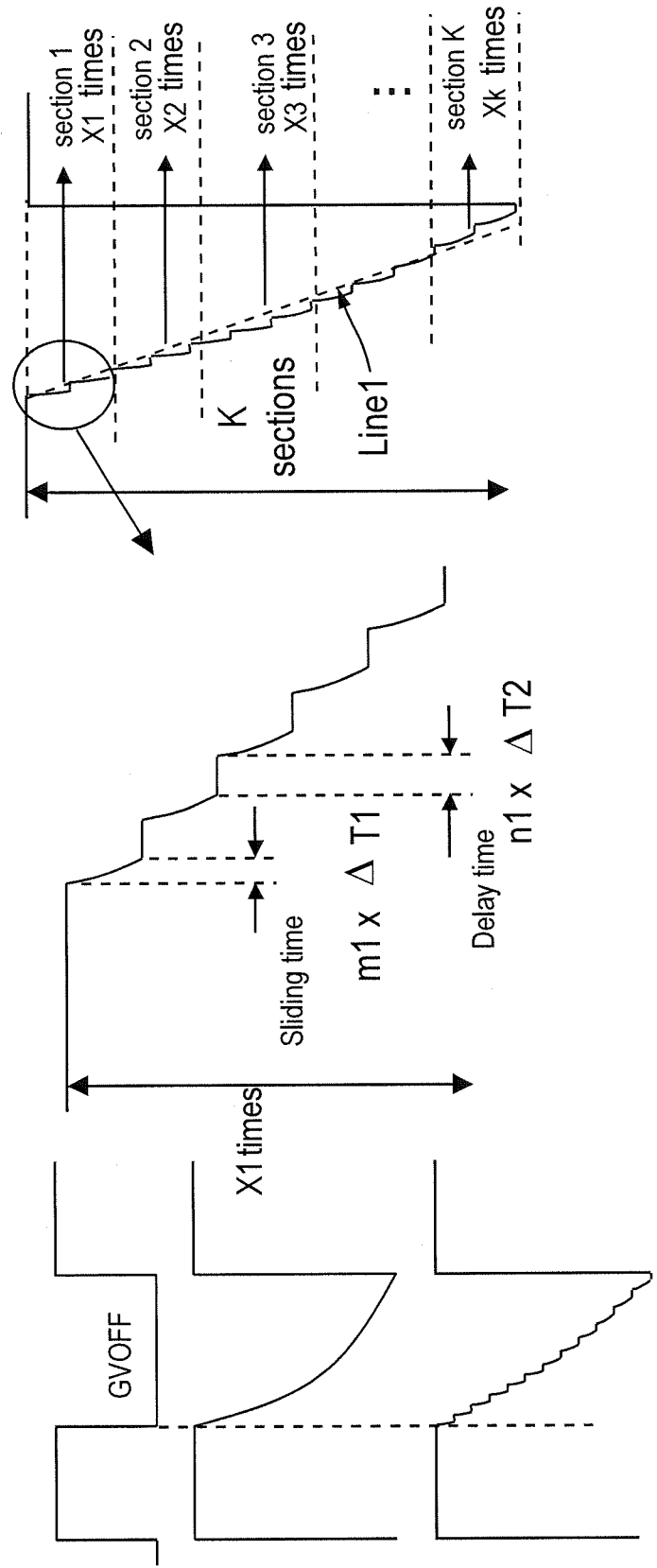
FIG. 7 schematically illustrates another operation of a gate pulse modulation waveform-shaping circuit in accordance with the invention.

FIG. 7 schematically illustrates another operation of a gate pulse modulation waveform-shaping circuit in accordance with the invention. As shown, the falling edge (Line1 or Line2) can be divided into k discharge sections. Each discharge section is composed of Xk discharge and delay time intervals. Each discharge and delay time interval is composed of mk discharge time intervals (ΔT1) and nk delay time intervals (ΔT2), and different discharge and delay time intervals may be provided with different Xk, nk, mk values, where Xk, nk, mk, k are each a natural number. As shown in FIG. 7, section 1 of Line1 is composed of X1 discharge and delay time intervals and each discharge and delay time interval is composed of m1 discharge time intervals ΔT1 and n1 delay time intervals ΔT2; section 2 of Line1 is composed of X2 discharge and delay time intervals and each discharge and delay time interval is composed of m2 discharge time intervals ΔT1 and n2 delay time intervals ΔT2; section 3 of Line1 is composed of X3 discharge and delay time intervals and each discharge and delay time interval is composed of m3 discharge time intervals ΔT1 and n3 delay time intervals ΔT2; section k of Line1 is composed of Xk discharge and delay time intervals and each discharge and delay time interval is composed of ink discharge time intervals ΔT1 and nk delay time intervals ΔT2.

FIG. 8 is a schematic diagram of detail data of each section in FIG. 7 in accordance with the invention. As shown, section 1 is composed of X1 discharge and delay time intervals and each discharge and delay time interval is composed of one discharge time interval S and one delay time interval D. The discharge time interval S is composed of m1 time intervals ΔT1. The discharge time interval S thus occupies a total duration of m1×ΔT1. The delay time interval D is composed of n1 time intervals ΔT2. The delay time interval D thus occupies a total duration of n1×ΔT2. The other discharge sections are similar, and thus a detailed description therefor is deemed unnecessary.

The first and second frequency oscillation signals f1 and f2 of the oscillator 211 are adjustable by selecting a specific range (r1 MHz to r2 MHz). Once the frequencies of the first and second frequency oscillation signals f1 and f2 are selected, they are fixed in different sections (sections 1-k). However, the frequencies of the first and second frequency oscillation signals f1 and f2 can be appropriately selected for different panels, depending on different RC values.

Figure 9:
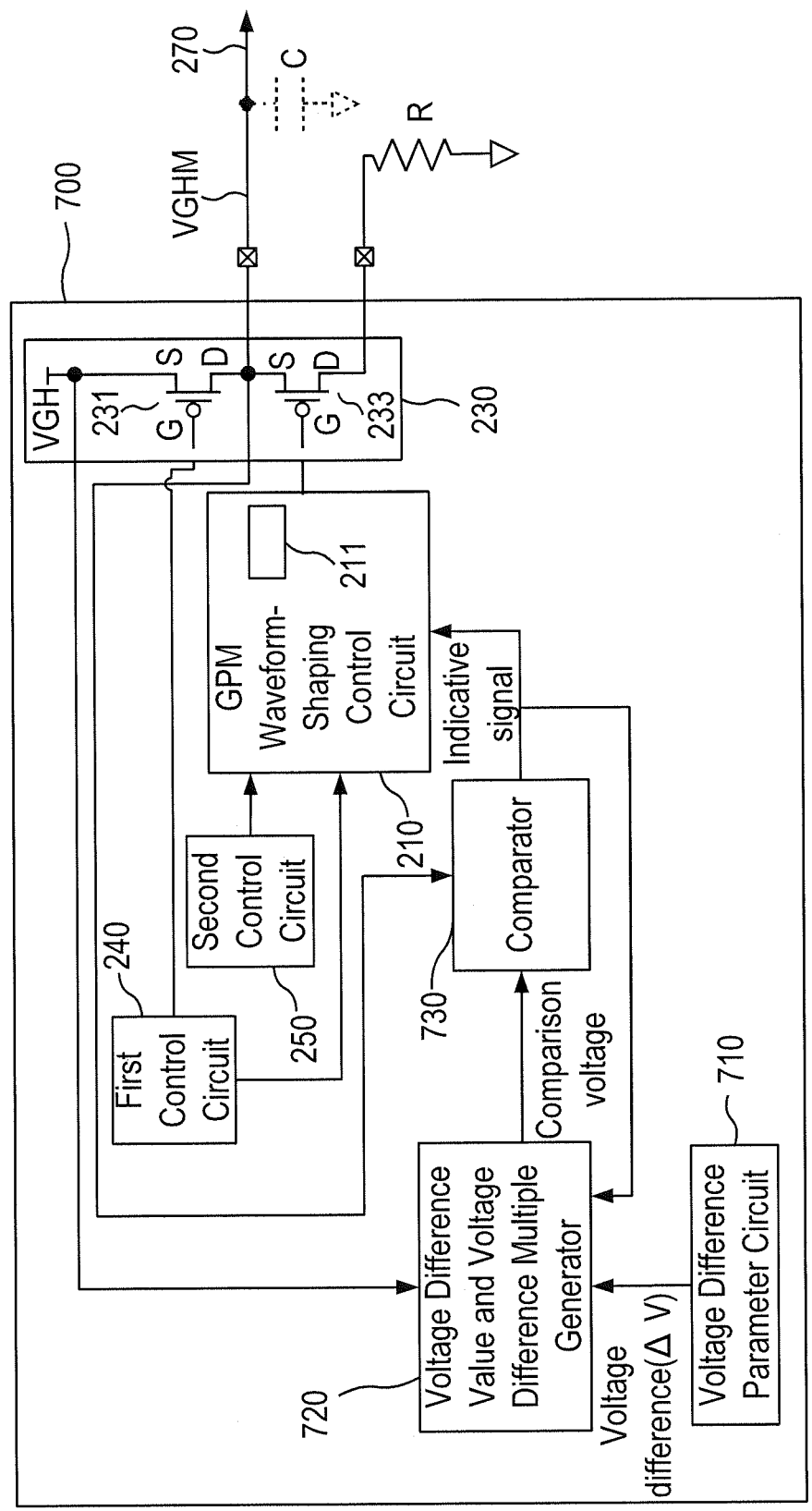
FIG. 9 is another block diagram of a gate pulse modulation waveform-shaping circuit in accordance with the invention.

FIG. 9 is another block diagram of the gate pulse modulation waveform-shaping circuit 700 in accordance with the invention, which is similar to that of FIG. 2 except that a voltage difference parameter circuit 710, a voltage difference value and voltage difference multiple generator 720, and a comparator 730 are added. The voltage difference parameter circuit 710 outputs the voltage differences ΔV1, ΔV2, ΔV3, etc. The voltage difference value and voltage difference multiple generator 720 is connected to the scan line 270 and the voltage difference parameter circuit 710 for generating comparison voltages with different voltage values according to the voltage differences ΔV1, ΔV2, ΔV3, etc. outputted by the voltage difference parameter circuit 710. The comparator 730 is connected to the scan line 270 and the voltage difference value and voltage difference multiple generator 720 for comparing the voltage VGHM on the scan line 270 and the comparison voltages so as to output an indicative signal.

The gate pulse modulation waveform-shaping control circuit 210 uses the indicative signal to adjust the additional delay time in addition to the basic discharge time, so as to generate the fixed discharge voltage thereby generating the desired delay. Thus, the discharge slope can be adjusted for generating different discharge time on the scan line.

Figure 10A:
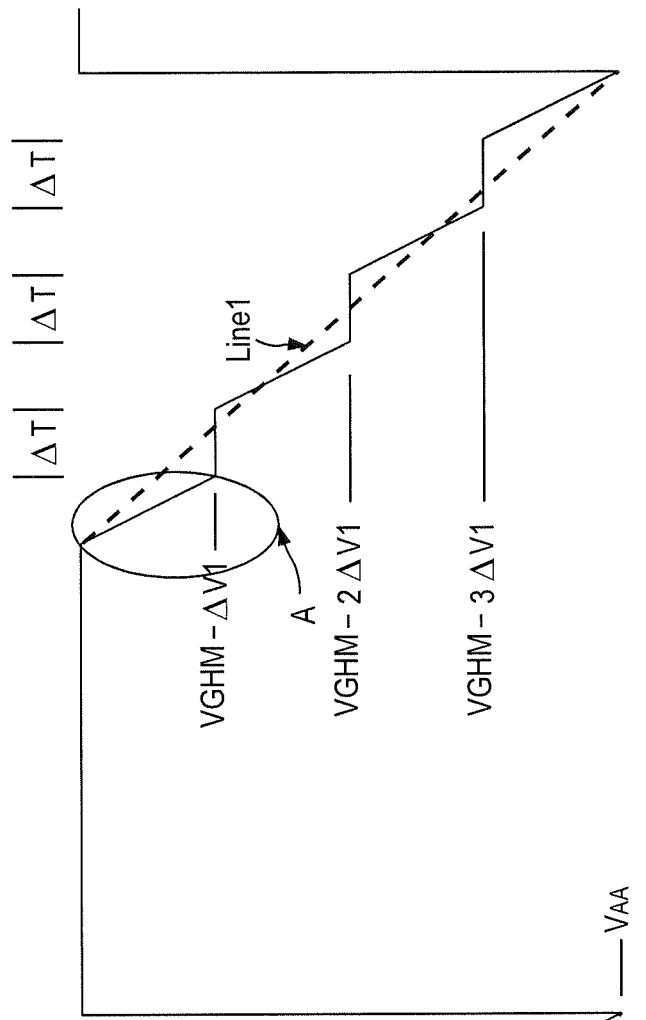
FIGS. 10A and 10B schematically illustrate another operation of a gate pulse modulation waveform-shaping circuit in accordance with the invention.
Figure 10A:
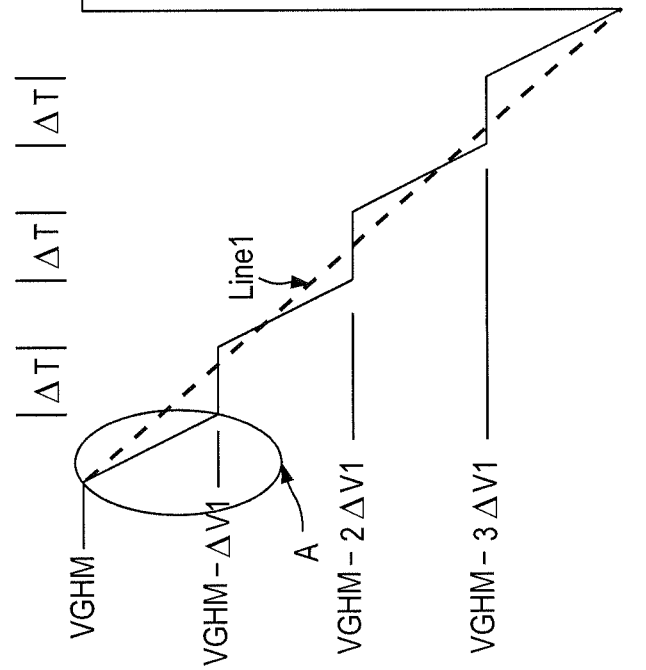
Figure 10B:
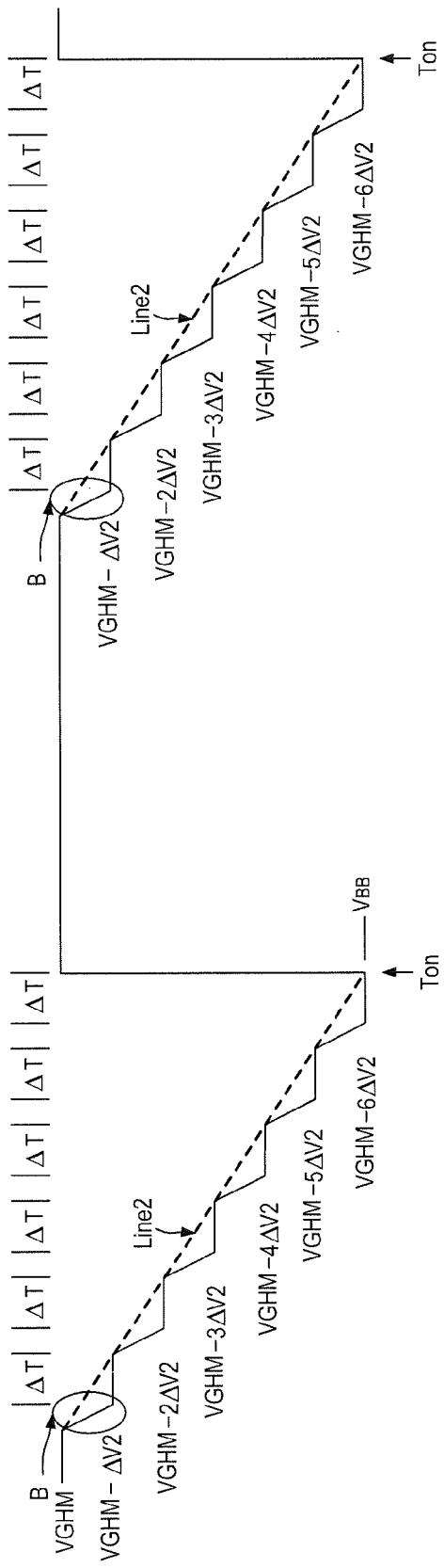

FIGS. 10A and 10B schematically illustrate another operation of the gate pulse modulation waveform-shaping circuit 210 in accordance with the invention. In FIG. 10A, before the voltage VGHM comes down to the value of VGHM−ΔV1, the gate pulse modulation waveform-shaping control circuit 210 turns on the second PMOS transistor 233 for performing a discharge. When the voltage VGHM reaches the value of VGHM−ΔV1, the gate pulse modulation waveform-shaping control circuit 210 turns off the second PMOS transistor 233 in the time interval ΔT to maintain the voltage VGHM. After the time interval ΔT, the gate pulse modulation waveform-shaping control circuit 210 turns on the second PMOS transistor 233. Before the voltage VGHM comes down to the value of VGHM−2ΔV1, the gate pulse modulation waveform-shaping control circuit 210 keeps turning on the second PMOS transistor 233 for performing a discharge. The aforementioned process is repeated. In FIG. 10B, ΔV1 is replaced with ΔV2 and the same operation is performed, so that a detailed description therefor is deemed unnecessary. By changing the voltage differences ΔV1, ΔV2, ΔV3, etc., the discharge slope can be adjusted, so as to generate different discharge time on the scan line, such that the gate output voltage has a voltage waveform including at least two waveform segments each with a non-zero sliding slope and at least two waveform segments each with a zero slope.

Figure 11:
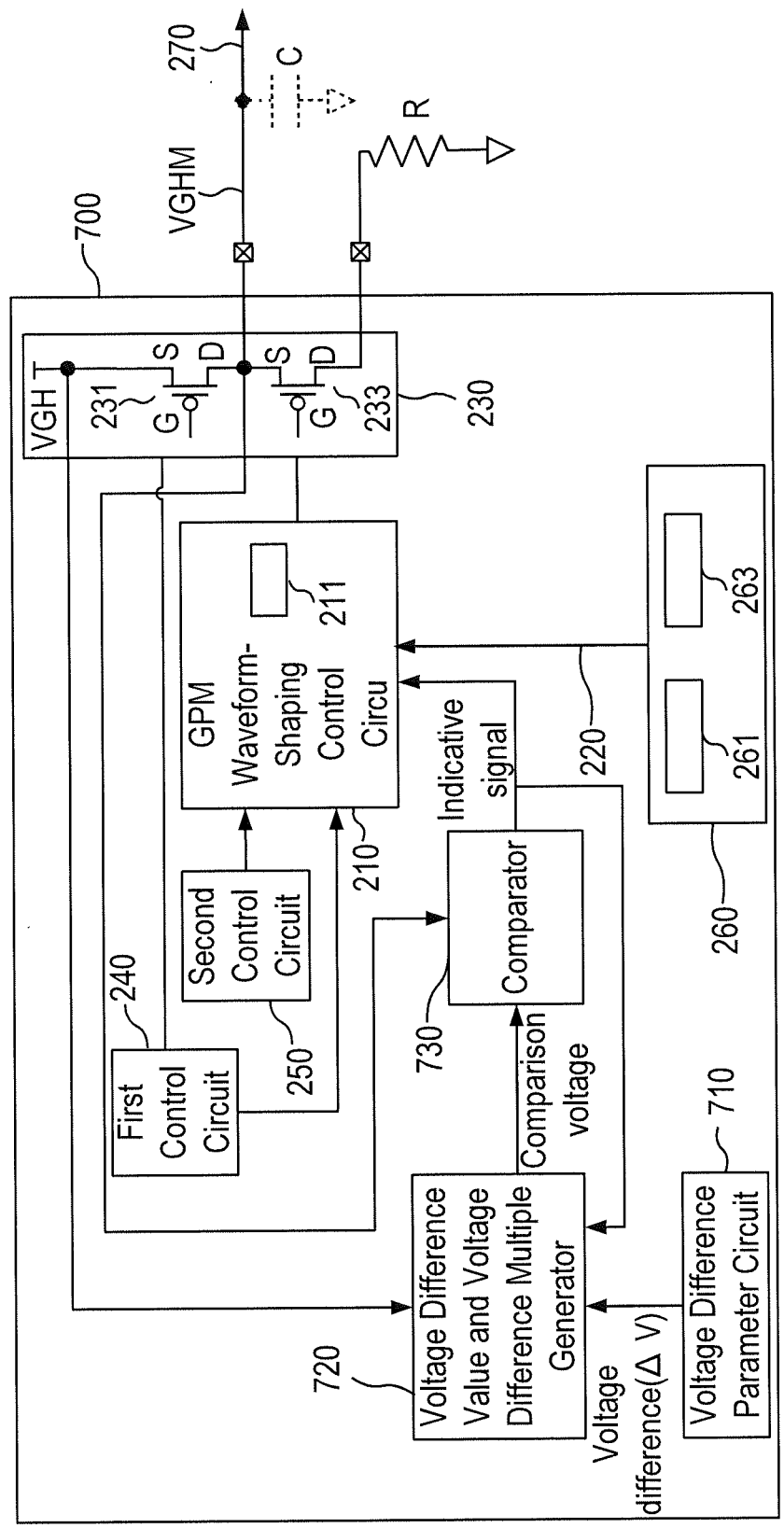
FIG. 11 is a further block diagram of a gate pulse modulation waveform-shaping circuit in accordance with the invention.

The time interval ΔT can be preset to a fixed value in the gate pulse modulation waveform-shaping control circuit 210. Alternately, the time interval ΔT can be set by using the delay register 263, and in this case the gate pulse modulation waveform-shaping circuit 700 of the invention is as shown in FIG. 11.

In view of the foregoing, it is known that the invention is capable of changing or shaping the voltage waveform on the scan line by using resistor of the same value, such that the waveform difference of the signal on the scan line close to and distant from the gate driver can be reduced. Thus, the brightness at left and right portions of a display frame is similar. In addition, the problem of overheating an IC can be overcome as the resistor implemented in the IC is avoided.

Although the present invention has been explained in relation to its embodiment, it is to be understood that many other possible modifications and variations can be made without departing from the spirit and scope of the invention as hereinafter claimed.

What is claimed is:

1. A gate pulse modulation waveform-shaping circuit comprising:
    an input terminal for receiving a control signal;
    an output pair connected to a scan line for outputting a gate output voltage; and
    a gate pulse modulation waveform-shaping control circuit connected to the output pair,
    wherein the gate pulse modulation waveform-shaping control circuit is based on the control signal to use a time interval or a fixed discharge voltage to generate a delay for adjusting a discharge slope thereby generating different discharge time on the scan line, so that the gate output voltage has a voltage waveform, the voltage waveform including a plurality of waveform segments, the voltage waveform including at least two of the waveform segments each with a non-zero sliding slope and at least two of the waveform segments each with a zero slope.

2. The gate pulse modulation waveform-shaping circuit as claimed in claim 1, further comprising:
   a first control circuit connected to the output pair for controlling output timing and voltage value of the gate output voltage; and
   a second control circuit connected to the gate pulse modulation waveform-shaping control circuit for controlling the output pair to be turned on and off.

3. The gate pulse modulation waveform-shaping circuit as claimed in claim 2, further comprising:
   a delay parameter circuit connected to the gate pulse modulation waveform-shaping control circuit for storing at least one code and using the at least one code to configure different parameters for adjusting additional delay time, in addition to a basic discharge time, thereby generating the time interval and the delay, so as to adjust the discharge slope for generating different discharge time on the scan line.

4. The gate pulse modulation waveform-shaping circuit as claimed in claim 3, wherein the output pair includes a first PMOS transistor and a second PMOS transistor.

5. The gate pulse modulation waveform-shaping circuit as claimed in claim 4, wherein the first control circuit is connected to the first PMOS transistor for turning on the first PMOS transistor so as to generate a rising edge of the gate output voltage.

6. The gate pulse modulation waveform-shaping circuit as claimed in claim 5, wherein the gate pulse modulation waveform-shaping control circuit is connected to the second PMOS transistor for turning on the second PMOS transistor so as to generate a falling edge of the gate output voltage having different discharge time.

7. The gate pulse modulation waveform-shaping circuit as claimed in claim 6, wherein the gate pulse modulation waveform-shaping control circuit further includes:
   an oscillator with different selectable frequencies to generate different discharge time intervals.

8. The gate pulse modulation waveform-shaping circuit as claimed in claim 7, wherein the falling edge of the gate output voltage includes k discharge sections, each discharge section being composed of Xk discharge and delay time intervals, each discharge and delay time interval being composed of mk discharge time intervals and nk delay time intervals, and different discharge and delay time intervals are provided with different Xk, nk, and mk values, where Xk, nk, mk, k are each a natural number.

9. The gate pulse modulation waveform-shaping circuit as claimed in claim 2, further comprising:
   a voltage difference parameter circuit for outputting different voltage differences;
   a voltage difference value and voltage difference multiple generator connected to the scan line and the voltage difference parameter circuit for generating comparison voltages with different voltage values according to the voltage differences outputted by the voltage difference parameter circuit; and
   a comparator connected to the scan line and the voltage difference value and voltage difference multiple generator for comparing the voltage on the scan line and the comparison voltages so as to output an indicative signal.

10. The gate pulse modulation waveform-shaping circuit as claimed in claim 9, wherein the gate pulse modulation waveform-shaping control circuit uses the indicative signal to adjust additional delay time, in addition to a basic discharge time, so as to generate the fixed discharge voltage thereby generating the delay, such that the discharge slope is adjusted for generating different discharge time on the scan line.

* * * * *